(12) United States Patent
Nebesnyi (10) Patent No.: US 9,514,264 B1
(45) Date of Patent: Dec. 6, 2016

(54) LAYOUTS OF TRANSMISSION GATES AND RELATED SYSTEMS AND TECHNIQUES

(71) Applicant: Bitfury Group Limited, George Town, Grand Cayman (KY)

(72) Inventor: Valerii Nebesnyi, Kiev (UA)

(73) Assignee: Bitfury Group Limited (KY)

( * ) Notice: Subject to any disclaimer, the term of this patent is extended or adjusted under 35 U.S.C. 154(b) by 0 days.

(21) Appl. No.: 14/988,502

(22) Filed: Jan. 5, 2016

(51) Int. Cl.
  *G06F 17/50* (2006.01)
(52) U.S. Cl.
  CPC ......... *G06F 17/5072* (2013.01); *G06F 17/505* (2013.01)
(58) Field of Classification Search
  CPC .... G06F 17/505; G06F 17/509; G06F 17/522; G06F 17/5068; G06F 17/5072; G06F 17/5077
  USPC ......... 716/100–104, 110, 119, 126, 132–135
  See application file for complete search history.

(56) References Cited

U.S. PATENT DOCUMENTS

| | | |
|---|---|---|
| 5,867,040 A | 2/1999 | Fuse et al. |
| 6,097,811 A | 8/2000 | Micali |
| 6,479,974 B2 | 11/2002 | Cohn et al. |
| 7,236,518 B2 | 6/2007 | Bazes |
| 7,329,968 B2 | 2/2008 | Shepard et al. |
| 7,373,527 B2 | 5/2008 | Chapuis |
| 7,493,504 B2 | 2/2009 | Chapuis |
| 7,562,326 B2 | 7/2009 | Wang et al. |
| 7,594,127 B2 | 9/2009 | Sutardja |
| 7,643,591 B2 | 1/2010 | Arsovski et al. |
| 7,702,929 B2 | 4/2010 | Sutardja |
| 7,707,521 B2 | 4/2010 | Tsai et al. |
| 7,710,192 B2 | 5/2010 | Kaeslin et al. |
| 7,788,509 B2 | 8/2010 | Sutardja |
| 7,788,510 B2 | 8/2010 | Sutardja |
| 7,823,107 B2 | 10/2010 | Arsovski et al. |
| 7,937,605 B2 | 5/2011 | Rea et al. |
| 8,122,279 B2 | 2/2012 | Yamaoka |
| 8,166,286 B2 | 4/2012 | Frank et al. |

(Continued)

FOREIGN PATENT DOCUMENTS

WO  WO-2014/201059 A1  12/2014
WO  WO-2015/077378 A1  5/2015

(Continued)

OTHER PUBLICATIONS

Paul D. Franzon, ECE 733 Class Notes: Latches and Flip Flops (2012), available at http://www.ece.ncsu.edu/asic/ece733/2013/docs/FlipFlops.pdf, pp. 1-81.

(Continued)

*Primary Examiner* — Paul Dinh
(74) *Attorney, Agent, or Firm* — Goodwin Procter LLP (57) ABSTRACT

Layouts of transmission gates and related techniques and systems are described. An integrated circuit may include first and second transmission gates disposed in a column, and metal wires. The first transmission gate includes first and second control terminals, and the second transmission gate includes first and second control terminals. The metal wires extend between the first and second transmission gates in a direction substantially orthogonal to the column, and include a first control wire coupled to the first control terminals of the first and second transmission gates.

18 Claims, 7 Drawing Sheets

(56) References Cited

U.S. PATENT DOCUMENTS

| | | | |
|---|---|---|---|
| 8,169,257 B2 | 5/2012 | Pelley | |
| 8,174,288 B2 | 5/2012 | Dennard et al. | |
| 8,274,319 B2 | 9/2012 | Maeno | |
| 8,605,845 B2 | 12/2013 | Chen et al. | |
| 8,624,646 B1 | 1/2014 | Bazes | |
| 8,742,464 B2 | 6/2014 | Sherlekar et al. | |
| 8,754,672 B2 | 6/2014 | Dennard et al. | |
| 8,797,084 B2 | 8/2014 | Friedman et al. | |
| 8,836,379 B2 | 9/2014 | Guntur et al. | |
| 8,856,704 B2 | 10/2014 | Baeg | |
| 8,878,387 B1 | 11/2014 | Wong et al. | |
| 8,918,667 B2 | 12/2014 | Ware et al. | |
| 8,941,150 B2 | 1/2015 | Sherlekar et al. | |
| 9,008,251 B2 | 4/2015 | Chen et al. | |
| 9,048,820 B2 | 6/2015 | Shi et al. | |
| 9,158,877 B2 | 10/2015 | Hsieh et al. | |
| 9,197,090 B2 | 11/2015 | Chao et al. | |
| 9,207,695 B2 | 12/2015 | Friedman et al. | |
| 2004/0076189 A1 | 4/2004 | Boerstler et al. | |
| 2009/0044163 A1* | 2/2009 | Wang | G06F 17/5068 716/119 |
| 2011/0145137 A1 | 6/2011 | Driemeyer et al. | |
| 2011/0246774 A1 | 10/2011 | Phillips, II et al. | |
| 2011/0307659 A1 | 12/2011 | Hans et al. | |
| 2013/0032885 A1 | 2/2013 | Swamynathan et al. | |
| 2014/0258765 A1 | 9/2014 | Persson | |
| 2014/0327081 A1 | 11/2014 | Hsieh et al. | |
| 2015/0168973 A1 | 6/2015 | Barber | |
| 2015/0294308 A1 | 10/2015 | Pauker et al. | |
| 2015/0370947 A1* | 12/2015 | Moroz | G06F 17/5077 716/119 |

FOREIGN PATENT DOCUMENTS

| | | |
|---|---|---|
| WO | WO-2015/095367 A2 | 6/2015 |
| WO | WO-2015/160565 A1 | 10/2015 |

OTHER PUBLICATIONS

Daniel Wiklund, Mesochronous clocking and communication in on-chip networks, Proc. Swedish System-on-Chip Conf. (Apr. 2003), 4 pages.

* cited by examiner

LAYOUTS OF TRANSMISSION GATES AND RELATED SYSTEMS AND TECHNIQUES

FIELD OF INVENTION

The present disclosure relates generally to circuit design and layout, and related systems and techniques. Some implementations relate specifically to layouts of transmission gates.

BACKGROUND

An integrated circuit (IC or "chip") design can be implemented using a library of building blocks or standard cells. Each library cell can implement a simple logic function such as NAND, NOR, inverse, and so on. Some library cells implement more complex operations. The layouts of different library cells implementing different logic functions can have a common height but different widths. The library cells can have horizontal tracks for voltage rails (e.g., a power supply voltage rail and a reference voltage (or "ground") rail), p-type diffusion, and n-type diffusion placed at the same respective vertical positions. For instance, the library cells can have horizontal power supply tracks at the top edges of the cells and horizontal ground tracks at the bottom edges of the cells (or vice versa). In this way, the design's layout can be implemented with rows of library cells laid out in a horizontal direction. Library cells in the same row can share common power and ground tracks that are continuous throughout the same row of library cells, for example. In addition, library cells in two adjacent rows can share the same power supply (or ground) track placed at the edge (a horizontal boundary) where the two rows of library cells abut.

A transmission gate is a logic gate that can selectively couple an output terminal to an input terminal or place the output terminal in a high-impedance state. A transmission gate generally includes an n-type metal-oxide-semiconductor (MOS) field-effect-transistor (FET) and a p-type FET connected in parallel, with the source terminals of the FETs coupled to each other and the drain terminals of the FETs coupled to each other. Source terminals of the n-type and p-type FETs are also coupled to the input terminal of the transmission gate. Drain terminals of the n-type and p-type FETs are coupled to the output terminal of the transmission gate. A gate terminal of one of the FETs is coupled to a first control terminal of the transmission gate, and the gate terminal of the other FET is coupled to a second control terminal of the transmission gate. In some implementations, the gate terminals are coupled to receive control signals that have complementary logic states. In this way, the value of the output terminal of the transmission gate can be the same as the value at the input terminal ("transmission"), or can be at a high-impedance state ("disconnected"), depending on the values of the control signals at the control terminals. (In some implementations, the transmission gate can have a single control terminal coupled to a single control signal. The control terminal can be coupled to a gate terminal of one of the transmission gate's FETs through a non-inverting path, and coupled to the gate terminal of the other FET through an inverting path.)

Multiple one-bit transmission gates can be used in parallel to implement a multiple-bit ("multi-bit" or "N-bit") transmission gate. An N-bit transmission gate can include N transmission gates controlled by the same two control signals, such that the N transmission gates are generally in the same state. In this way, the N output terminals of the N transmission gates can be placed in the high-impedance state or coupled to the corresponding N input terminals of the N transmission gates in parallel.

SUMMARY OF THE INVENTION

One-bit (one data input bit and one data output bit) transmission gates and/or multi-bit (multiple data input bits and corresponding data output bits) transmission gates can be used to implement logic functions of an IC design. A circuit that implements a logic function using transmission gates can consume less power than a circuit that implements the same logic function using other standard logic building blocks (e.g., complementary MOS or CMOS NAND gates). Thus, implementing at least some of an integrated circuit's logic functions using transmission gates can significantly reduce the IC's overall power consumption.

However, it is generally difficult to efficiently implement transmission gates (particularly multi-bit transmission gates) using conventional IC design libraries. When conventional library cells are used to implement a multi-bit transmission gate, multiple one-bit transmission gates are generally laid out in the same row of cells, and metal wires are generally routed horizontally, within the height of the cell and between power supply and ground rails, to connect the shared control terminals of the one-bit transmission gates to each other (and to the corresponding control terminal of the multi-bit transmission gate). Given the height constraint of a conventional library cell, routing for horizontal wires coupling the control terminals of multiple one-bit transmission gates can be congested. For example, it may be necessary to route portions of the wire(s) forming the shared control terminals over portions of one or more of the one-bit transmission gates, and/or to route portions of those wire(s) around other tracks (e.g., tracks that connect the one-bit transmission gates to their respective input and output ports). Such routing can require the use of more than one metal layer, which can further increase the width, and thus the area, of the multi-bit transmission gate (e.g., due to additional vias used for connecting routing between metal layers).

The inventors have recognized and appreciated that the IC area occupied by a multi-bit transmission gate can be reduced (relative to multi-bit transmission gates implemented using conventional techniques) by placing multiple one-bit transmission gates of a multi-bit transmission gate in a column (rather than placing the one-bit transmission gates in the same row) and by arranging adjacent one-bit transmission gates in the column to share IC features (e.g., metal lines, polysilicon patterns, etc.) that carry control signals that are used by the adjacent one-bit transmission gates.

In some embodiments, the multi-bit transmission gate can be implemented using standard cells, with the column of one-bit transmission gates formed across multiple rows of standard cells. In some embodiments, the multiple-bit transmission gate can be implemented using a custom cell. The techniques described herein can, in some embodiments, reduce the area of standard-cell-based and/or custom-cell-based multi-bit transmission gates.

For example, placing the one-bit transmission gates in a column can greatly reduce the complexity and congestion of the IC features that couple the control terminals of the one-bit transmission gates to receive shared control signals, thereby reducing the total area of the multi-bit transmission gate. For example, control terminals of the one-bit transmission gates in adjacent rows can share compact IC features that carry a shared control signal. Instead of the IC features that carry the shared control signals being routed between the power supply and ground rails, atop other one-bit transmission gates, and around IC features for input and output ports, the IC features carrying the shared control signals can be routed, for example, using IC features that run horizontally between the adjacent one-bit transmission gates.

Particular embodiments of the subject matter described in the present disclosure can be implemented to realize one or more of the above-described advantages.

According to an aspect of the present disclosure, an integrated circuit is provided. The integrated circuit includes a plurality of transmission gates disposed in a column, one or more first metal wires, one or more second metal wires, and one or more third metal wires. The plurality of transmission gates includes first and second transmission gates. The first transmission gate includes first and second control terminals. The second transmission gate includes first and second control terminals. The one or more first metal wires extend between the first and second transmission gates in a direction substantially orthogonal to the column. The one or more first metal wires include a first control wire coupled to the first control terminals of the first and second transmission gates. The one or more second metal wires extend above the first and second transmission gates in the direction substantially orthogonal to the column, and include a second control wire coupled to the second control terminal of the first transmission gate. The one or more third metal wires extend below the first and second transmission gates in the direction substantially orthogonal to the column, and include a third control wire coupled to the second control terminal of the second transmission gate.

In some embodiments, the plurality of transmission gates further includes a third transmission gate, the third transmission gate includes first and second control terminals, and the second control wire extends between the first and third transmission gates and is coupled to the second control terminal (not numbered) of the third transmission gate. In some embodiments, the plurality of transmission gates further includes a fourth transmission gate, the fourth transmission gate includes first and second control terminals, and the third control wire extends between the second and fourth transmission gates and is coupled to the second control terminal of the fourth transmission gate.

In some embodiments, the one or more first metal wires further include a first power supply wire coupled to provide a first power supply voltage, the one or more second metal wires further include a second power supply wire coupled to provide a second power supply voltage, and the one or more third metal wires further include a third power supply wire coupled to provide the second power supply voltage.

In some embodiments, the column of transmission gates is a first column, the integrated circuit further includes a plurality of latch circuits disposed in a second column proximate the first column, and the plurality of latch circuits includes a first latch circuit and a second latch circuit. In some embodiments, the first latch circuit has a data input terminal coupled to a data terminal of the first transmission gate, and the second latch circuit has a data input terminal coupled to a data terminal of the second transmission gate. In some embodiments, respective power supply terminals of the first latch circuit are coupled to the first power supply wire and the second power supply wire. In some embodiments, respective power supply terminals of the second latch circuit are coupled to the first power supply wire and the third power supply wire. In some embodiments, the integrated circuit includes a plurality of flip-flops including a first flip-flop and a second flip-flop, the first flip-flop includes the first transmission gate and the first latch, and the second flip-flop includes the second transmission gate and the second latch.

In some embodiments, the one or more first metal wires further include a first enable wire coupled to a first enable terminal of the first latch circuit, to a first enable terminal of the second latch circuit, and to the second and third control wires. In some embodiments, the one or more second metal wires further include a second enable wire coupled to a second enable terminal of the first latch circuit. In some embodiments, the one or more third metal wires further include a third enable wire coupled to a second enable terminal of the second latch circuit, to the second enable wire, and to the first control wire. In some embodiments, the integrated circuit further includes a cell including the transmission gates, latch circuits, and metal wires, wherein a height of the cell is between 750 nm and 850 nm.

In some embodiments, the first transmission gate includes a first n-type field-effect transistor (NFET) and a first p-type field-effect transistor (PFET), and the second transmission gate includes a second NFET and a second PFET. In some embodiments, the first control terminal of the first transmission gate includes a gate terminal of the first NFET, the second control terminal of the first transmission gate includes a gate terminal of the first PFET, the first control terminal of the second transmission gate includes a gate terminal of the second NFET, and the second control terminal of the second transmission gate includes a gate terminal of the second PFET. In some embodiments, the control terminals of the first and second transmission gates are vertically aligned.

According to another aspect of the present disclosure, a computer-implemented electronic design automation method is provided. The method includes synthesizing, by a computer, an integrated circuit layout from a description of a circuit, the circuit including a multi-bit transmission gate. A portion of the integrated circuit layout corresponding to the multi-bit transmission gate includes a plurality of transmission gates disposed in a column, one or more first metal wires, one or more second metal wires, and one or more third metal wires. The plurality of transmission gates includes first and second transmission gates. The first transmission gate includes first and second control terminals. The second transmission gate includes first and second control terminals. The one or more first metal wires extend between the first and second transmission gates in a direction substantially orthogonal to the column. The one or more first metal wires include a first control wire coupled to the first control terminals of the first and second transmission gates. The one or more second metal wires extend above the first and second transmission gates in the direction substantially orthogonal to the column, and include a second control wire coupled to the second control terminal of the first transmission gate. The one or more third metal wires extend below the first and second transmission gates in the direction substantially orthogonal to the column, and include a third control wire coupled to the second control terminal of the second transmission gate.

In some embodiments, the description of the circuit includes a logical description of the circuit. In some embodiments, the description of the circuit includes a schematic and/or a netlist. In some embodiments, the method further includes simulating, by a computer, operation of the portion of the integrated circuit layout corresponding to the multi-bit transmission gate. In some embodiments, the method further includes generating, by a computer, a plurality of mask patterns for fabricating the integrated circuit including the multi-bit transmission gate.

Other aspects and advantages of the invention will become apparent from the following drawings, detailed description, and claims, all of which illustrate the principles of the invention, by way of example only.

BRIEF DESCRIPTION OF THE DRAWINGS

Certain advantages of some embodiments may be understood by referring to the following description taken in conjunction with the accompanying drawings. In the drawings, like reference characters generally refer to the same parts throughout the different views. Also, the drawings are not necessarily to scale, emphasis instead generally being placed upon illustrating principles of some embodiments of the invention.

DETAILED DESCRIPTION

Some embodiments of layouts for circuits are described below. By way of illustration, metal layers described herein for layout are denoted as metal 1, metal 2, . . . , and metal N. As used herein, "metal 1" is the routing layer closest to transistor gates in the layout, "metal 2" is the next routing layer above metal 1, and so on, with metal N being the routing layer furthest from the substrate. A connection between two metal layers is denoted as a "via." A connection between metal 1 layer and a transistor gate or diffusion area is denoted as a "contact."

Figure 1B:
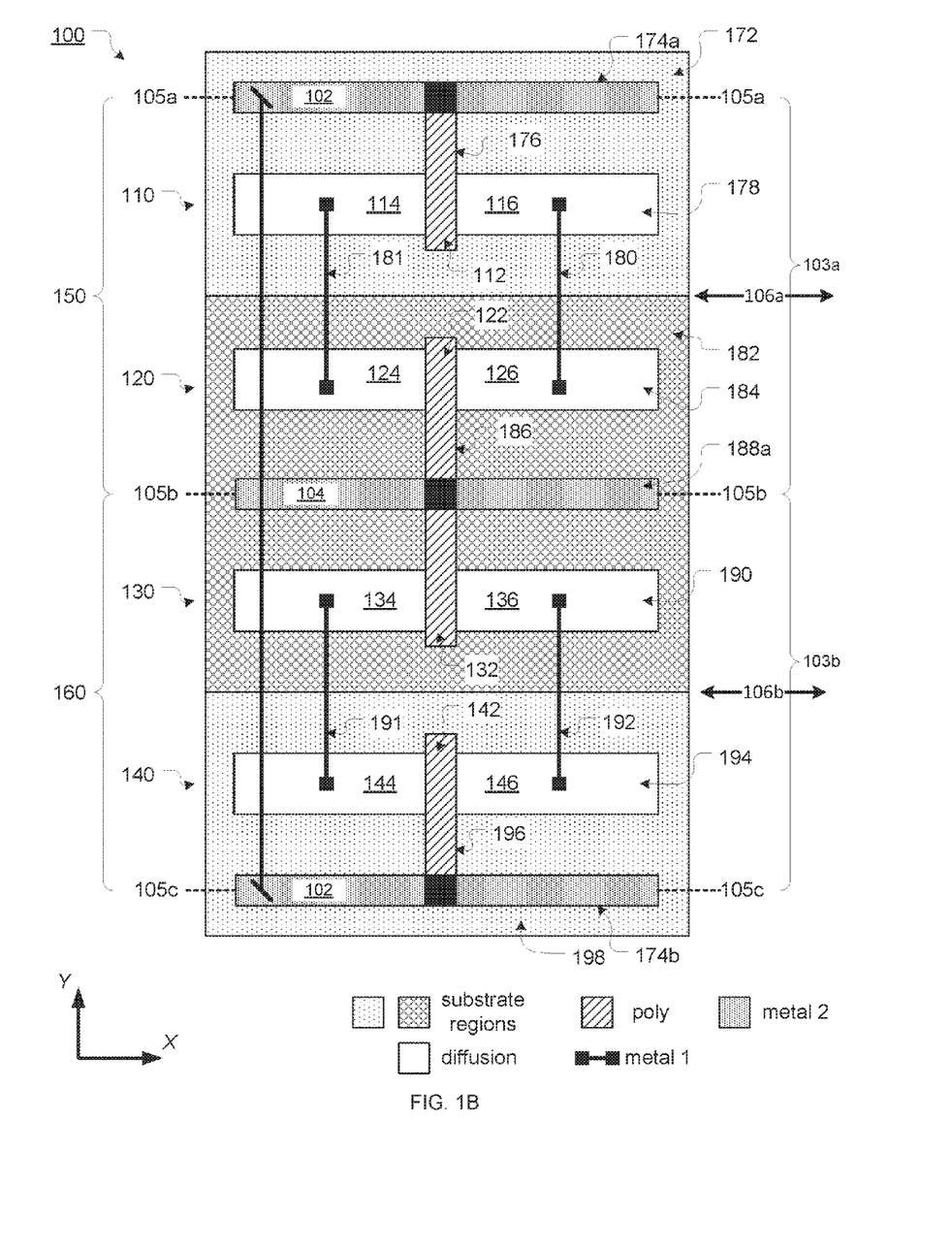

In the circuit layouts described herein, for ease of illustration, circuit terminals and/or signals are described as being assigned to particular metal layers. However, one of ordinary skill in the art will appreciate that, in some embodiments, terminals and/or signals can be assigned to particular metal layers other than the metal layers illustrated herein. In particular, the assignment of metal layers to terminals and/or signals as shown in FIGS. 1B, 2B, and 3B, should be understood as illustrative and not limiting.

Figure 1A:
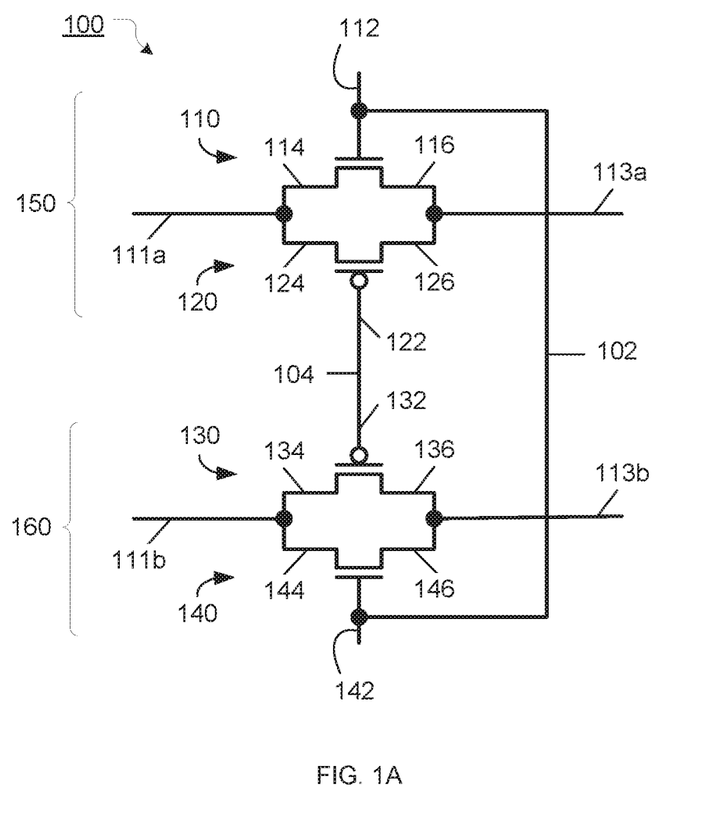
FIGS. 1A and 1B, respectively, show a schematic and a layout of a two-bit transmission gate, in accordance with some embodiments.

FIG. 1A is a schematic of a two-bit transmission gate 100, according to some embodiments. The state of the two-bit transmission gate 100 is controlled by control signals applied to control terminals 102 and 104. When the two-bit transmission gate is in the transmission state, the output data terminals 113a-b are coupled to the input data terminals 111a-b, respectively. When the two-bit transmission gate 100 is in the disconnected state, the output data terminals 113a-b are disconnected from the input terminals 111a-b, and placed in a high-impedance state.

In the example of FIG. 1A, the two-bit transmission gate 100 includes two one-bit transmission gates 150 and 160 that share the same control signals, which are provided at control terminals 102 and 104. The transmission gate 150 includes an n-type FET 110 and a p-type FET 120. In the transmission gate 150, one pair of diffusion terminals 114 and 124 (e.g., sources) of the FETs 110 and 120, respectively, are coupled together. The other pair of diffusion terminals 116 and 126 (e.g., drains) of the FETs 110 and 120, respectively, are also coupled together. In the transmission gate 160, one pair of diffusion terminals 134 and 144 (e.g., sources) of the FETs 130 and 140, respectively, are coupled together. The other pair of diffusion terminals 136 and 146 (e.g., drains) of the FETs 130 and 140, respectively, are also coupled together.

The gate terminals of the FETs 110 and 140 are coupled to the control terminal 102. The gate terminals of the FETs 120 and 130 are coupled to the control terminal 104. Signals at the control terminals 102 and 104 can have complementary logic states (e.g., "0" and "1" respectively, or "1" and "0" respectively) and are configured to control the state of the two-bit transmission gate 100 (e.g., whether the bits at the input data terminals (111a, 111b) are passed through to the respective output data terminals (113a, 113b).

In some embodiments, the signals at the control terminals 102 and 104 can be derived from a common signal. For example, one of the control terminals 102/104 can be coupled to the common signal through a non-inverting path (e.g., through no inverters or an even number of inverters), and the other control terminal 102/104 can be coupled to the common signal through an inverting path (e.g., through an odd number of inverters).

FIG. 1B shows a layout of the two-bit transmission gate 100, according to some embodiments. For the one-bit transmission gate 150 of the two-bit transmission gate 100, the gate 112 of the n-type FET 110 is formed by a polysilicon ("poly") pattern 176 atop an n-type diffusion pattern 178, with the gate 112 separating the diffusion terminals 114 and 116 of the FET 110. The n-type diffusion pattern 178 can be, for example, an n-type well (formed from an n-type diffusion process) in a substrate region 172 (e.g., a p-type region of a silicon or silicon-on-oxide substrate). In some embodiments, the n-type diffusion pattern 178 is an n-type diffusion strip formed in the horizontal direction (X-direction) on top of the substrate region 172. The poly gate pattern 176 is coupled (e.g., through a contact, a metal 1 stub, and a via between metal 1 and metal 2 layers) to the metal line 174a (e.g., at metal 2 layer), which forms a portion of the control terminal 102 and carries the corresponding control signal.

The gate 122 of the p-type FET 120 (of the one-bit transmission gate 150) is formed by a poly pattern 186 atop a p-type diffusion pattern 184, with the gate 122 separating the diffusion terminals 124 and 126 of the FET 120. The p-type diffusion pattern 184 can be, for example, a p-type well (formed from a p-type diffusion process) in a substrate region 182 (e.g., an n-type region of a silicon or silicon-on-oxide substrate). In some embodiments, the p-type diffusion pattern 184 is a p-type diffusion strip in the horizontal direction on top of the substrate region 182. The poly gate pattern 186 is coupled (e.g., through a contact, a metal 1 stub, and a via between metal 1 and metal 2 layers) to the metal line 188a (e.g., at metal 2 layer), which forms at least a portion of the control terminal 104 and carries the corresponding control signal.

In the layout of the transmission gate 150 in FIG. 1B, one pair of diffusion terminals 116 and 126 of the FETs 110 and 120, respectively, are coupled through a connection 180, for example, at the metal 1 layer. The other pair of diffusion terminals 114 and 124 of the FETs 110 and 120, respectively, can be coupled together through another connection 181, for example, at the metal 1 layer.

In some embodiments of the layout of the two-bit transmission gate 100, the one-bit transmission gate 160 is placed in the same column as the one-bit transmission gate 150 (e.g., the one-bit transmission gates 150 and 160 are aligned in the vertical ("Y") direction). In the example of FIG. 1B, the one-bit transmission gate is disposed in the same column as the one-bit transmission gate 150, with the transmission gate 160 below the transmission gate 150 in the vertical direction.

In the layout of FIG. 1B, the gate 132 of the p-type FET 130 (of the one-bit transmission gate 160) is formed by the poly pattern 186 atop a p-type diffusion pattern 190, with the gate 132 separating the diffusion terminals 134 and 136 of the FET 130. Similarly to the p-type diffusion pattern 184, the p-type diffusion pattern 190 can be a p-type well in the substrate region 182, or a p-type diffusion strip in the horizontal direction on top of the substrate region 182. As described earlier, the poly gate pattern 186 is coupled to the metal line 188a that forms at least a portion of the control terminal 104, and also forms the gate 122 of the p-type FET 120 of the one-bit transmission gate 150.

In the layout of FIG. 1B, the gate 142 of the n-type FET 140 (of the one-bit transmission gate 160) is formed by a poly pattern 196 atop an n-type diffusion pattern 194, with the gate 142 separating the diffusion terminals 144 and 146 of the FET 140. Similarly to the n-type diffusion pattern 178, the n-type diffusion pattern 194 can be an n-type well in a substrate region 198 (e.g., a p-type region of a silicon or silicon-on-oxide substrate), or an n-type diffusion strip in the horizontal direction on top of the substrate region 198. The poly pattern 196 is coupled to a metal line 174b (e.g., at metal 2 layer), which forms a portion of the control terminal 102 and carries the corresponding control signal.

In the layout of the transmission gate 160 in FIG. 1B, one pair of diffusion terminals 136 and 146 of the FETs 130 and 140, respectively, are coupled through a connection 192, for example, at the metal 1 layer. The other pair of diffusion terminals 134 and 144 of the FETs 130 and 140, respectively, can be coupled together through another connection 191, for example, at the metal 1 layer.

In some embodiments, the components of the two-bit transmission gate 100 (e.g., the one-bit transmission gates 150 and 160, the FETs 110, 120, 130, and 140, the gates 112, 122, 132, and 142, etc.) are arranged in a column (e.g., a vertical column) in a custom cell, such that the two-bit transmission gate is not formed by arranging and coupling two or more standard cells.

In some embodiments, the components of the two-bit transmission gate 100 (e.g., the one-bit transmission gates 150 and 160, the FETs 110, 120, 130, and 140, the gates 112, 122, 132, and 142, etc.) are arranged in a column (e.g., a vertical column) across two rows of library cells of an IC design incorporating the two-bit transmission gate 100. For instance, the one-bit transmission gate 150 of the two-bit transmission gate 100 can be placed in a cell 103a in library-cell row 106a (e.g., a horizontal row), and the one-bit transmission gate 160 of the two-bit transmission gate 100 can be placed in a cell 103b of the library-cell row 106b, with components of the two-bit transmission gate 100 arranged in a column that spans the library cells rows 103a and 103b.

In some embodiments, the cells of the row 106a have the same height (e.g., the distance in the Y-direction between dashed lines 105a and 105 b in FIG. 1B). In some embodiments, the cells of the row 106b have the same height (e.g.,
the distance in the Y-direction between dashed lines 105b and 105c in FIG. 1B). The heights of rows 106a and 106b can be the same or different.

As shown in FIG. 1B, the gate terminals 122 and 132 of the FETs 120 and 130 can be coupled to the shared control terminal 104 (metal line 188a) through the vertical poly pattern 186. By vertically coupling the gate terminals 122 and 132 to the shared control terminal 104 (e.g., a control terminal placed along a boundary between two rows of library cells), some embodiments of this layout can use less area of the integrated circuit substrate in comparison with a conventional layout in which the two one-bit transmission gates 150 and 160 are placed side-by-side in the same library cell row. The conventional side-by-side layout of the one-bit transmission gates would generally use additional area to accommodate IC features (e.g., metal lines) on top of one of the one-bit transmission gates to connect the other one-bit transmission gate to the shared control signal.

In some embodiments, the power supply rail and/or ground rail of a library cell row 106 may be discontinuous ("broken") in at least one metal layer at a transmission gate cell 103. In many IC designs that include rows of standard cells, power supply rails and/or ground rails (not shown in FIG. 1B) are placed, for example, along the boundaries (e.g., dashed lines 105a, 105b, 105c) between rows of library cells and are shared between the two adjacent rows of library cells. Such supply and ground rails can be implemented, for example, using metal 1 wires or metal 2 wires. However, in some embodiments of the layout of FIG. 1B, the metal 2 wire 188a corresponding to the control terminal 104 and carrying a control signal shared by the two one-bit transmission gates 150 and 160 is routed along the row boundary 105b between the two one-bit transmission gates, to facilitate coupling of the gates (122, 132) of the FETs 120 and 130 to the shared control terminal 104 (through, for example, a contact, a metal 1 stub, and a via between the metal 1 stub and the metal 2 line 188a). In embodiments in which a metal line corresponding to a transmission gate control terminal is routed along a portion of a row boundary (105b) between transmission gate cells, any power and/or ground rails routed along the same row boundary between other cells (e.g., in the metal 1 or metal 2 layers) can be discontinuous ("broken") at the location of the boundary between the transmission gate cells. In some embodiments, the power supply and/or ground coupling between cells on opposite sides of the transmission gate cells may be maintained by routing the power supply and/or ground signals through metal wires in a different metal layer (e.g., metal 3).

In some embodiments, the transmission gate cells 103a and 103b include components not shown in FIG. 1B. For example, the cell 103a may include one or more additional metal lines including, but not limited to, a metal line that functions as a power supply rail, and/or a metal line that functions as a ground rail. Such a metal line can be implemented in any suitable metal layer(s). In some embodiments, one or more of the power supply rail(s) and/or ground rail(s) may be disposed proximate to a metal line that functions as a control terminal for the transmission gate 100. For example, a power supply rail or a ground rail may be disposed below the metal line 174b in the Y-direction, between the metal line 174b and the diffusion pattern 194, between the diffusion pattern 190 and the metal line 188a, between the metal line 188a and the diffusion pattern 184, between the diffusion pattern 178 and the metal line 174a, and/or above the metal line 174a in the Y-direction.

As described above in reference to FIGS. 1A and 1B, two one-bit transmission gates of a two-bit transmission gate can be placed in a column, and two adjacent FETs in the one-bit transmission gates can be coupled to a shared IC feature (e.g., metal line, polysilicon pattern, etc.) that carries a shared control signal and is routed horizontally (e.g., perpendicular to the column direction) between the two one-bit transmission gates (e.g., along a row boundary between two standard cells in which the one-bit transmission gates are formed). More generally, N one-bit transmission gates of an N-bit transmission gate (N>1) can be placed in a column, and each pair of adjacent FETs in adjacent one-bit transmission gates of the N-bit transmission gate can be coupled to a shared IC feature that carries a shared control signal and is routed horizontally, as described in more detail below with reference to FIGS. 2A and 2B.

Figure 2A:
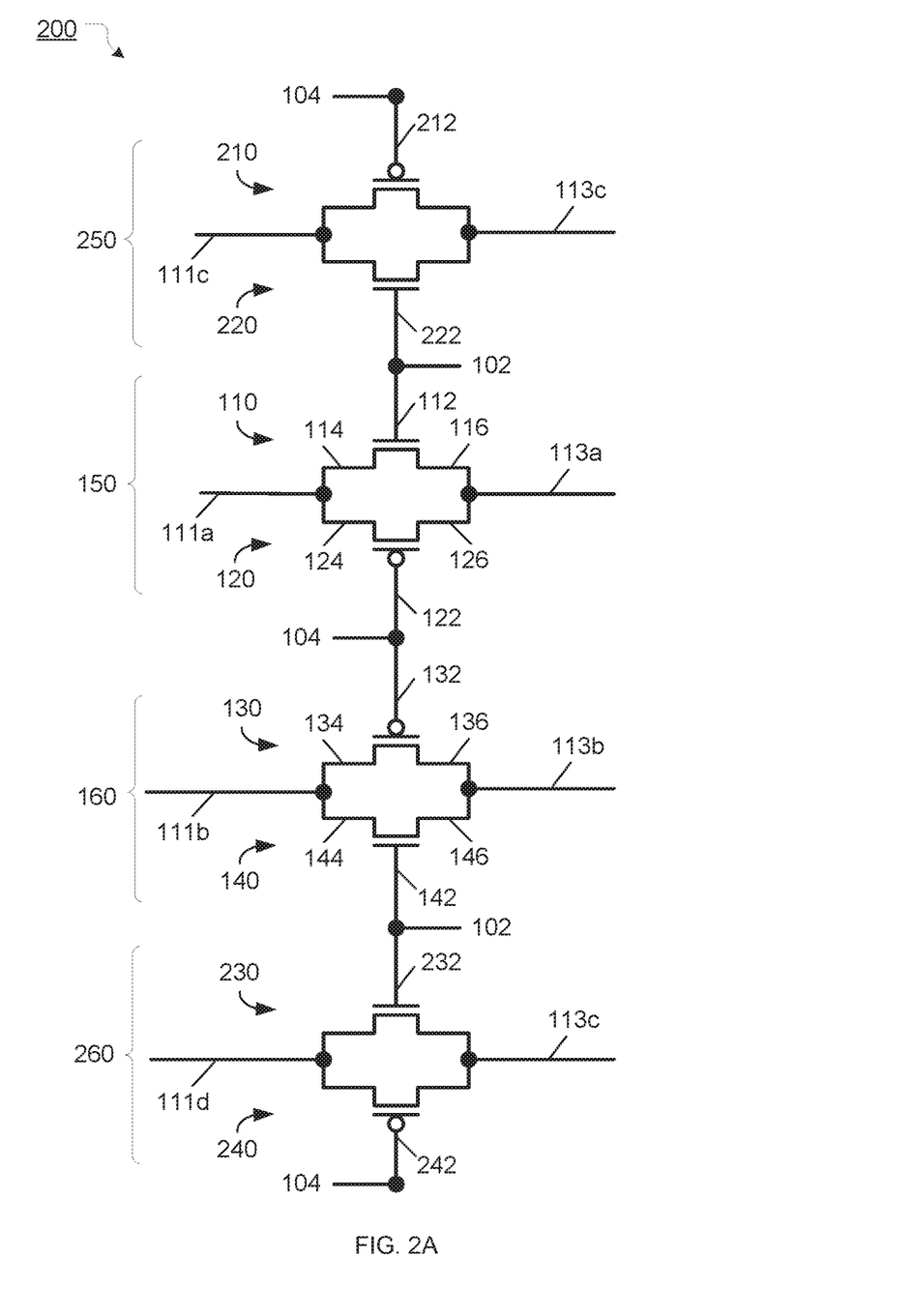
FIGS. 2A and 2B, respectively, show a schematic and a layout of a four-bit transmission gate, in accordance with some embodiments.
Figure 2B:
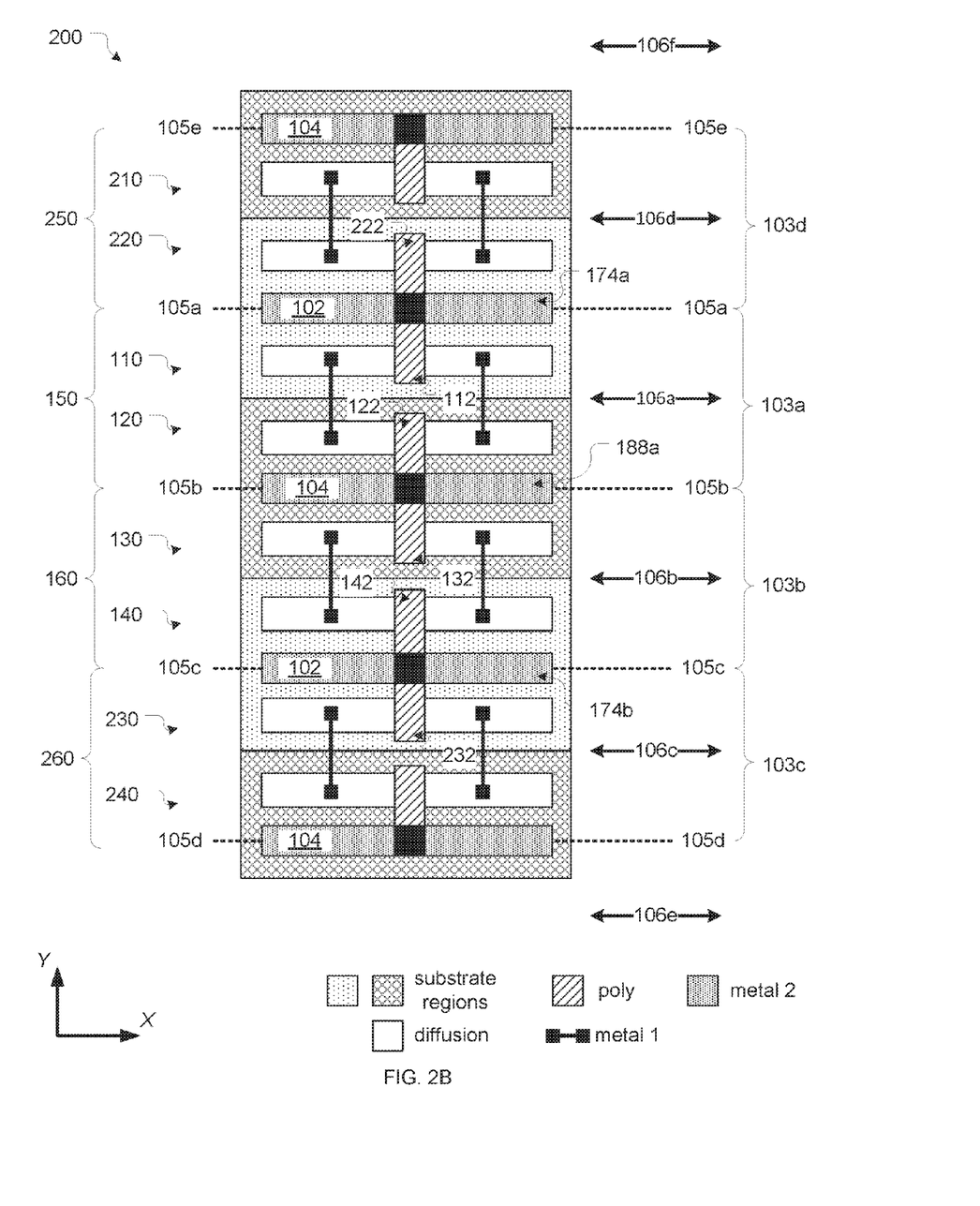

FIG. 2A shows a schematic of a four-bit transmission gate 200, according to some embodiments. The state of the four-bit transmission gate 200 is controlled by control signals applied to control terminals 102 and 104. When the two-bit transmission gate is in the transmission state, the output data terminals 113a-d are coupled to the input data terminals 111a-d, respectively. When the four-bit transmission gate 200 is in the disconnected state, the output data terminals 113a-d are disconnected from the input terminals 111a-d, and placed in a high-impedance state.

In the example of FIG. 2A, the four-bit transmission gate 200 includes four one-bit transmission gates. By way of illustration, the four-bit transmission gate 200 includes two one-bit transmission gates 150 and 160 arranged as described with reference to FIGS. 1A and 1B, and another two one-bit transmission gates 250 and 260. Each one-bit transmission gate includes an n-type FET and a p-type FET connected in parallel.

In the example of FIG. 2A, the gates of the FETs in the four-bit transmission gate 200 are controlled by control signals carried by the control terminals 102 and 104. These control signals, which control the state of the four "bits" (the four one-bit transmission gates) of the four-bit transmission gate 200, can have complementary values. The gate terminal 212 of the FET 210 of the one-bit transmission gate 250 is coupled to the control terminal 104. The gate terminal 242 of the FET 240 of the one-bit transmission gate 260 is also coupled to the control terminal 104.

As can be seen, the four-bit transmission gate 200 includes three pairs of FETs (FETs 220 and 110, FETs 120 and 130, and FETs 140 and 230) such that the two FETs in the FET pair (1) are adjacent to each other, (2) are part of different (adjacent) transmission gates, and (3) share the same control signal. In particular, the gate terminal 222 of the FET 220 of the one-bit transmission gate 250 and the gate terminal 112 of the FET 110 of the one-bit transmission gate 150 are adjacent and are both coupled to receive the shared control signal carried by the control terminal 102. The gate terminal 122 of the FET 120 of the one-bit transmission gate 150 and gate terminal 132 of the FET 130 of the one-bit transmission gate 160 are adjacent and are both coupled to receive the shared control signal carried by the control terminal 104. The gate terminal 232 of the FET 230 of the one-bit transmission gate 260 and gate terminal 142 of the FET 140 of the one-bit transmission gate 160 are adjacent and are both coupled to receive the shared control signal carried by the control terminal 102. As will be discussed below, each of these FET pairs can be laid out densely, thereby reducing the size of the four-bit transmission gate.

FIG. 2B shows a layout of the four-bit transmission gate 200, according to some embodiments. In the example of FIG. 2B, the one-bit transmission gates 250, 150, 160, and 260 of the four-bit transmission gate 200 are placed in the same column (in the vertical or "Y" direction). In some embodiments, the column is disposed in a custom cell, such that the four-bit transmission gate is not formed by arranging and coupling two or more standard cells. In some embodiments, the column spans multiple rows (106d, 106a, 106b, 106c) of standard cells. In some embodiments, each row 106 has the same height between its boundaries (e.g., 105e, 105a, 105b, 105c, 105d). In some embodiments, there are additional rows (e.g., 106f, 106e) of library cells above or below the four-bit transmission gate 200 in the vertical direction.

As described earlier, pairs of FETs that (1) are adjacent to each other, (2) are part of different (adjacent) transmission gates, and (3) share the same control signal can be laid out densely, in some embodiments. Examples of such pairs of FETs include FETs 220 and 110, FETs 120 and 130, and FETs 140 and 230. For instance, the gate terminal 222 of the FET 220 of the one-bit transmission gate 250 and the gate terminal 112 of the FET 110 of the one-bit transmission gate 150 are both coupled the metal 2 line 174a that carries the shared control signal corresponding to control terminal 102. In embodiments in which the FETs 220 and 110 are located in different rows of standard cells, the horizontal metal 2 line 174a can be placed along the boundary 105a between the cells 103d and 103a that contain the one-bit transmission gates 250 and 150, respectively.

As another example, the gate terminal 122 of the FET 120 of the one-bit transmission gate 150 and the gate terminal 132 of the FET 130 of the one-bit transmission gate 160 are both coupled to the metal 2 line 188a that carries the shared control signal corresponding to the control terminal 104. In embodiments in which the FETs 120 and 130 are located in different rows of standard cells, the horizontal metal 2 line 188a can be placed along the boundary 105b between the cells 106a and 106b that contain the one-bit transmission gates 150 and 160, respectively.

As yet another example, the gate terminal 142 of the FET 140 of the one-bit transmission gate 160 and the gate terminal 232 of the FET 230 of the one-bit transmission gate 260 are both coupled to the metal 2 line 174b that carries the shared control signal corresponding to the control terminal 102. In embodiments in which the FETs 140 and 230 are located in different rows of standard cells, the horizontal metal 2 line 174b can be placed along the boundary 105c between the cells 103b and 103c that contain the one-bit transmission gates 160 and 260, respectively.

By vertically coupling the gate terminals of adjacent FETs from vertically aligned, one-bit transmission gates to a shared control terminal (e.g., a control terminal placed horizontally along a boundary of two rows of library cells), some embodiments of the layout of FIG. 2B can use less area of the integrated circuit substrate in comparison with a conventional layout in which the four one-bit transmission gates are placed side-by-side in the same library cell row. The conventional side-by-side layout of the one-bit transmission gates would generally use additional area to accommodate IC features (e.g., metal lines) on top of the one-bit transmission gates to couple the gates of the FETs to the shared control signals.

Figure 3A:
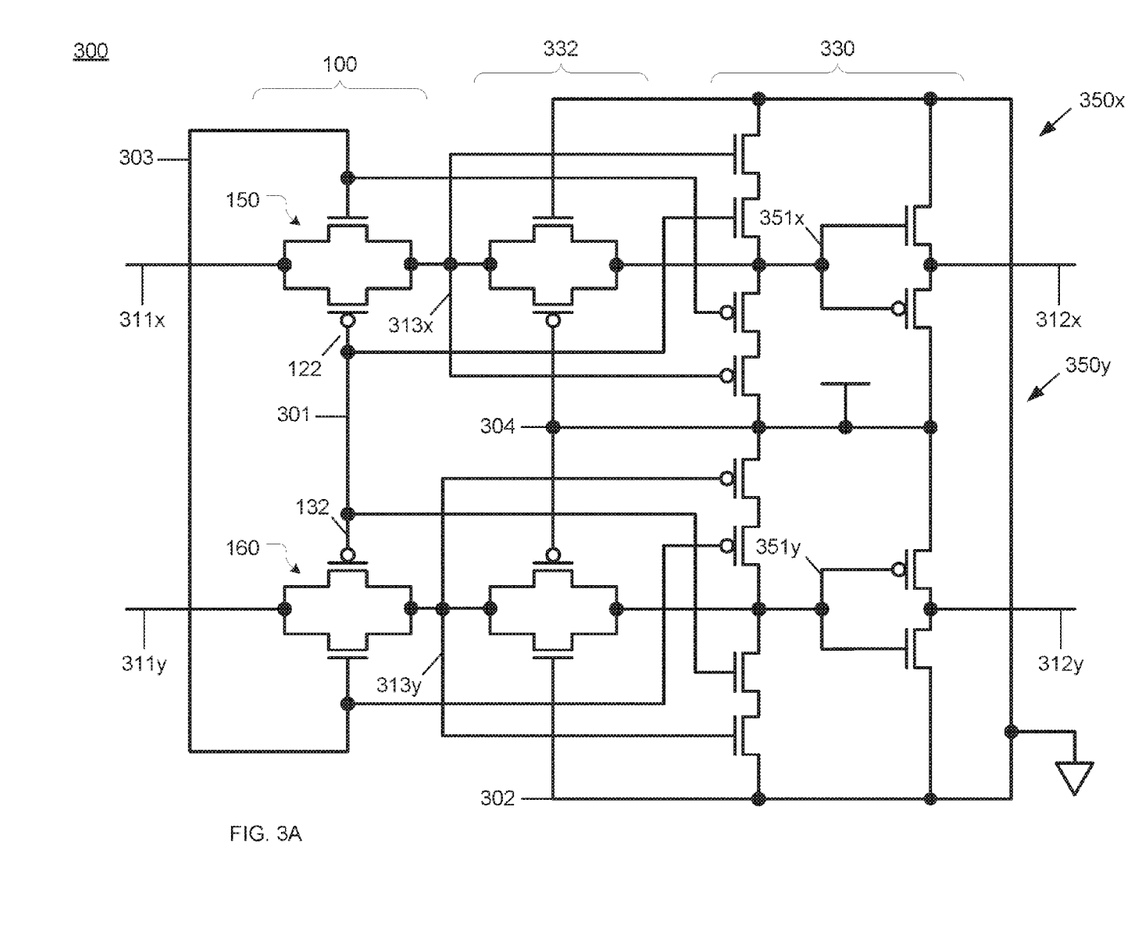
FIGS. 3A and 3B, respectively, show a schematic and a layout of a clock-controlled D flip-flop, in accordance with some embodiments.
Figure 3B:
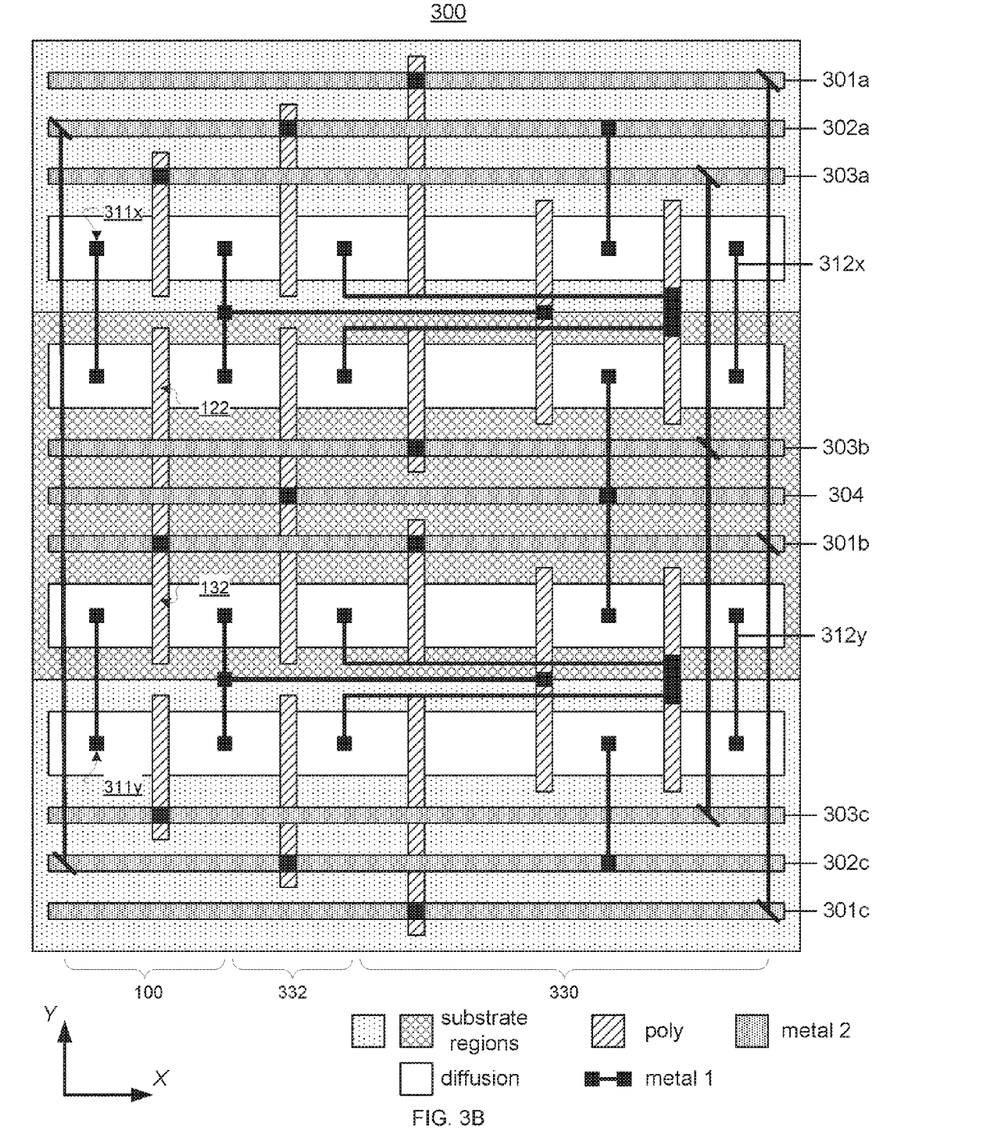

FIGS. 3A and 3B illustrate an example of a circuit that incorporates a multi-bit transmission gate. In particular, FIG. 3A shows a schematic of a clock-controlled, two-bit D flip-flop 300, according to some embodiments. The clock-controlled two-bit D flip-flop 300 includes a two-bit transmission gate 100, a two-bit dummy circuit 332, and a two-bit D latch 330. In FIG. 3A, the two-bit D flip-flop has two input data terminals (311x, 311y) and two output data terminals (312x, 312y).

The two-bit transmission gate 100 control writing (latching) of input data at the data input terminals 313x and 313y of the two-bit D flip-flop 330. In the example of FIG. 3A, the two-bit transmission gate 100 includes a one-bit transmission gates 150 and 160. The state of the two-bit transmission gate 100 is controlled by control signals applied to control terminals 301 and 303. In some embodiments, the control signals applied to the control terminals 301 and 303 of the two-bit transmission gate 100 are a pair of differential clock signals (e.g., CLKP and CLKN, respectively) that generally have complementary values. In such embodiments, the two-bit transmission gate 100 can operate in the transmission state, thereby coupling the data inputs 313 of the two-bit D latch to the data inputs 311 of the two-bit D flip-flop, when the differential clock signal is in a first state (e.g., CLKP represents a 0-bit and CLKN represents a 1-bit). By contrast, when the differential clock signal is in a second state (e.g., CLKP is 1 and CLKN is 0), the two-bit transmission gate 100 can operate in the high-impedance state, thereby holding the data inputs 313 of the two-bit D latch at their previous values, irrespective of changes in the signals applied to the data inputs 311 of the two-bit transmission gate 100.

The two-bit dummy circuit 332 functions to electrically disconnect the data inputs (313x, 313y) of the two-bit D latch from the nodes (351x, 351y) that store the two-bit flip-flop's internal state. Such dummy circuits can be advantageous, for example, if the two-bit D flip flop 300 is manufactured using a semiconductor fabrication process in which there are penalties associated with physically disconnecting two portions of a diffusion pattern. In the example of FIG. 3A, the two-bit dummy circuit 332 is implemented using a two-bit transmission gate 100. However, as can be seen in FIG. 3A, the gate terminals of the dummy circuit's n-type FETs and p-type FETs are coupled, respectively, to a ground rail 302 and to a supply voltage rail 304. In this way, the dummy circuit's transmission gates can operate indefinitely in the high-impedance state.

In the example of FIG. 3A, the two-bit D latch includes two one-bit D latches 350x and 350y. Each one-bit D latch 350 has differential clock terminals that are coupled to the control terminals 301 and 303 to receive the components of the differential clock signal (e.g., CLKP, CLKN). Each one-bit D latch 350 also has a data input terminal 313 coupled to the output terminal of the corresponding one-bit transmission gate. One of ordinary skill in the art will understand how each of the one-bit D latches operates.

FIG. 3B shows a layout of the clock-controlled, two-bit D flip-flop 300, according to some embodiments. In FIG. 3B, metal 2 lines 301a, 301b, and 301c form portions of the control terminal 301 and carry the corresponding control signal (e.g., CLKP). Metal 2 lines 303a, 303b, and 303c form portions of the control terminal 303 and carry the corresponding control signal (e.g., CLKN). Lines 302a and 302c are ground rails, and line 304 is a power supply rail. The ground and power supply rails can be routed with metal 2 lines, for example. Other metal layers and/or additional metal layers can be used to route the ground and power supply rails.

In the example of FIG. 3B, the one-bit transmission gates of the two-bit transmission gate 100 are placed in a vertical column, with the gate terminals 122 and 132 of the FETs 120 and 130, respectively, coupled to the metal line 301b carrying the corresponding shared control signal (e.g., CLKP). In some embodiments, the column is disposed in a custom cell, such that the two-bit transmission gate is not formed by coupling two standard cells in adjacent rows of standard cells. In some embodiments, the column spans two rows of standard cells. In embodiments in which the FETs 120 and 130 are located in different rows of standard cells, the horizontal metal 2 line 301b can be placed along the horizontal boundary between the cells that contain the FETs 120 and 130, respectively.

In some embodiments, the multi-bit transmission gate described herein may be integrated into any suitable device including, without limitation, a microprocessor, liquid-crystal display (LCD) panel, light-emitting diode (LED) display panel, television, mobile electronic device (e.g., laptop computer, tablet computer, smart phone, mobile phone, smart watch, etc.), computer (e.g., server computer, desktop computer, etc.), bitcoin mining device, etc.

Electronic Design Automation (EDA) Tools

In some embodiments, an electronic design automation (EDA) tool can be configured to facilitate design, simulation, verification, and manufacturing of circuits that include transmission gates using the techniques described herein. In general, EDA tools are used to design, simulate, verify, and/or prepare for manufacturing of electronic systems (e.g., integrated circuits, printed circuit boards, etc.).

Figure 4:
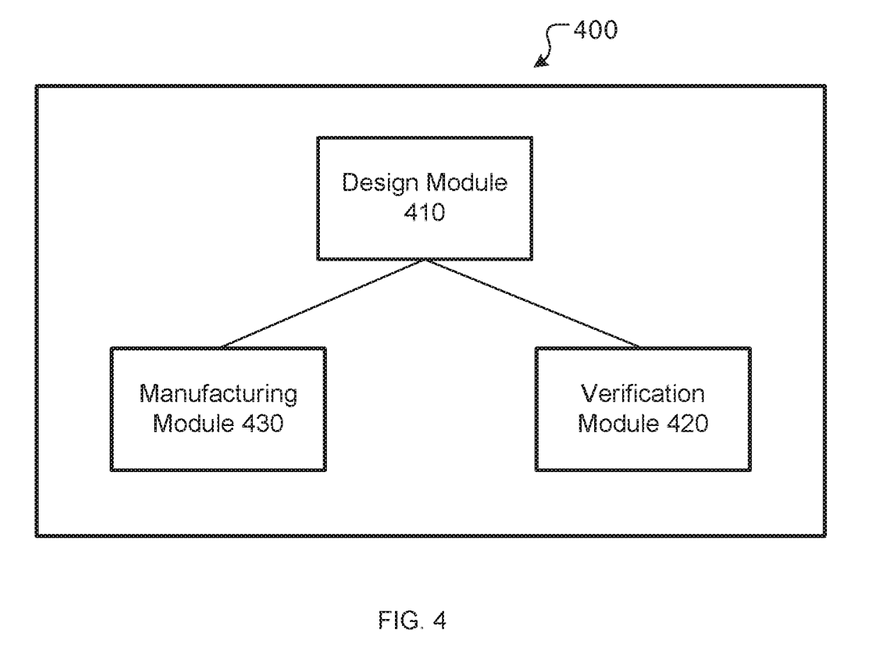
FIG. 4 is a block diagram of an electronic design automation (EDA) tool, in accordance with some embodiments.

As shown in FIG. 4, some embodiments of an EDA tool 400 can include one or more modules, for example, a design module 410, a verification module 420, and/or a manufacturing module 430. The design module 410 can be operable to perform one or more design steps, including, without limitation, a system design step, a logic design step, a circuit synthesis step, a floor planning step, and/or a physical implementation step. In the system design step, the design module 410 can receive (e.g., from a user) a description of the functionality to be implemented by the system, and can perform hardware-software architecture partitioning of the described functionality. Examples of EDA software tools from Synopsys, Inc. that can be used to perform the system design step include Model Architect, Saber, System Studio, and DesignWare® products.

In the logic design step, the design module 410 can obtain a high-level logical description of the system (e.g., a description of the system in a hardware design language (HDL), including, but not limited to Verilog or VHDL). In some embodiments, the design module 410 generates the logical description of the system (or portions thereof) based on the functional description of the system. In some embodiments, the design module 410 receives the logical description of the system (or portions thereof) from a user. Examples of EDA software tools from Synopsys, Inc. that can be used to perform the logic design step include VCS, VERA, DesignWare®, Magellan, Formality, ESP and LEDA products.

In the synthesis step, the design module 410 can translate the high-level logical description of the system into a circuit schematic, which can be represented by a netlist or any other suitable description of a circuit's components and connections there between. In some embodiments, this synthesis step can include selection of one or more standard cells to perform logic functions specified in the high-level logical description of the circuit. In some embodiments, the schematic can be customized for a particular IC technology (e.g., the IC technology that will be used to implement the system). Examples of EDA software tools from Synopsys, Inc. that can be used to perform the synthesis step include Design Compiler®, Physical Compiler, DFT Compiler, Power Compiler, FPGA Compiler, TetraMAX, and DesignWare® products.

In the floor planning step, the design module 410 can generate a floor plan for an IC that will implement the system or a portion thereof. Examples of EDA tools from Synopsys, Inc. that can be used to perform the floor planning step include Astro and Custom Designer products.

In the physical implementation step, the design module 410 can generate a representation of a physical implementation of the system (e.g., a physical layout of the components of the system on an IC). Generating the representation of the system's physical implementation may include "placing" the circuit's components (determining positions on the IC for the circuit's components) and routing the circuit's connections (determining the positions on the IC of the electrical conductors coupling the circuit's components). In some embodiments, this physical implementation step can include selection of one or more standard cells to implement circuit components included in the circuit schematic. Examples of EDA tools from Synopsys, Inc. that can be used to perform the physical implementation step include the Astro, IC Compiler, and Custom Designer products.

Returning to FIG. 4, the verification module 420 can perform one or more verification steps, including, without limitation, a simulation step, a functional verification step, a schematic verification (e.g., netlist verification) step, a transistor-level verification step, a floor plan verification step, and/or a physical verification step. In the simulation step, the verification module 420 can simulate the operation of a representation of the system (e.g., a high-level logical description, circuit schematic, floor plan, or layout of the system).

In the functional verification step, the verification module 420 can check the high-level logical description of the system for functional accuracy. For example, the verification module 420 can simulate the operation of the high-level logical description of the circuit in response to particular inputs to determine whether the logical description of the circuit produces correct outputs in response to the inputs. Examples of EDA tools from Synopsys, Inc. that can be used at the functional verification step include VCS, VERA, DesignWare®, Magellan, Formality, ESP and LEDA products.

In the schematic verification step, the verification module 420 can check the system schematic (e.g., the system netlist) for compliance with applicable timing constraints and for correspondence with the high-level logical description of the circuit. Examples of EDA tools from Synopsys, Inc. that can be used at the verification step include Formality, PrimeTime, and VCS products.

In the transistor-level verification step, the verification module 420 can check a transistor-level representation of the system for compliance with applicable timing constraints and for correspondence with the high-level logical description of the circuit. Examples of EDA tools from Synopsys, Inc. that can be used at the transistor-level verification step include AstroRail, PrimeRail, PrimeTime, and Star-RCXT products.

In the floor plan verification step, the verification module 420 can check the floor plan of the system for compliance with applicable constraints (e.g., timing, top-level routing, etc.).

In the physical verification step, the verification module 420 can check the representation of the physical implementation of the system (e.g., a physical layout of the system components on an IC) for compliance with manufacturing constraints, electrical constraints, lithographic constraints, and/or schematic constraints. The Hercules product from Synopsys, Inc. is an example of an EDA tool that can be used at the physical verification step.

Returning to FIG. 4, the manufacturing module 430 can perform one or more steps to prepare for manufacturing the system, including, without limitation, a tape-out step and/or a resolution enhancement step. In the tape-out step, the manufacturing module 430 can generate tape-out data to be used (e.g., after lithographic enhancements are applied) for production of masks for lithographic fabrication of ICs that implement the system. Examples of EDA tools from Synopsys, Inc. that can be used at the tape-out step include the IC Compiler and Custom Designer families of tools.

In the resolution enhancement step, the manufacturing module 430 can perform geometric manipulations of the system's physical layout to improve manufacturability of the IC. Examples of EDA software products from Synopsys, Inc. that can be used at this resolution enhancement step include Proteus, ProteusAF, and PSMGen tools.

An EDA tool can perform an EDA method including one or more (e.g., all) of the above-described design, verification, and/or manufacturing steps in any suitable order. In some embodiments, one or more of the design, verification, and/or manufacturing steps can be performed iteratively (e.g., until the tool determines that the system satisfies particular constraints and/or passes particular tests).

In some embodiments, one or more EDA tools can operate to design, verify, and/or fabricate a circuit that includes a multi-bit transmission gate. For example, an EDA tool may be used to synthesize a schematic of a circuit that includes one or more multi-bit transmission gates (e.g., based on a logical description of the circuit or portions thereof). Alternatively, a user may provide the EDA tool with a schematic of a circuit that includes one or more multi-bit transmission gates. Based on the schematic (or any other suitable representation of the circuit), the EDA tool may generate a representation of a physical implementation of the circuit (e.g., a physical layout of the components of the circuit on an IC).

In the physical layout of the circuit, a multi-bit transmission gate may include multiple one-bit transmission gates disposed in a column (e.g., in the manner illustrated in FIGS. 1B and 2B). In some embodiments, the column is disposed in a custom cell, such that the multi-bit transmission gate is not formed by arranging and coupling two or more standard cells. In some embodiments, the column spans multiple rows of standard cells. In some embodiments, the multi-bit transmission gate includes one or more pairs of FETs such that the two FETs in the FET pair (1) are adjacent to each other, (2) are part of different transmission gates, and (3) share the same control signal. In some embodiments, the gates of the two FETs in such a FET pair are vertically coupled (e.g., by a polysilicon pattern) to a metal line that carries the shared control signal.

As another example, an EDA tool may generate lithographic masks suitable for fabricating the physical implementation of the circuit, including the multi-bit transmission gate. In some embodiments, these lithographic masks can be used with one or more process technologies to fabricate an IC that implements the circuit.

Further Description of Some Embodiments

Some embodiments of an EDA tool 400 (or one or more modules thereof, or one or more methods, steps, or operations performed by an EDA tool 400 or one or more modules thereof) can be implemented in digital electronic circuitry, or in computer software, firmware, and/or hardware, including the structures disclosed herein and their structural equivalents, or in combinations of one or more of them. Implementations of the subject matter described in this disclosure can be implemented as one or more computer programs, i.e., one or more modules of computer program instructions, encoded on a computer storage medium for execution by, or to control the operation of, data processing apparatus.

Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

Some embodiments of the methods, steps, and tools described in the present disclosure can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, for example web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language resource), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some embodiments of the processes and logic flows described in this disclosure can be performed by one or more programmable processors executing one or more computer programs to perform actions by operating on input data and generating output. Some embodiments of the processes and logic flows described herein can be performed by, and some embodiments of the apparatus described herein can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both.

Figure 5:
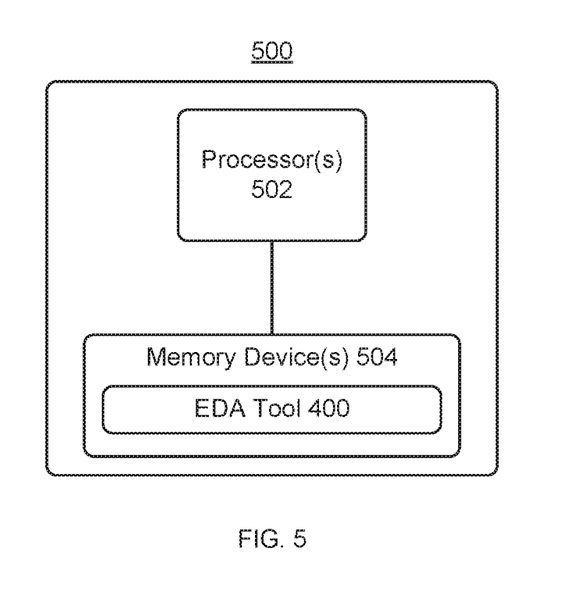
FIG. 5 is a block diagram of a computer, in accordance with some embodiments.

FIG. 5 shows a block diagram of a computer 500. The elements of the computer 500 include one or more processors 502 for performing actions in accordance with instructions and one or more memory devices 504 for storing instructions and data. In some embodiments, the computer 500 executes an EDA tool 400. Different versions of the EDA tool 400 may be stored, distributed, or installed. Some versions of the software may implement only some embodiments of the methods described herein.

Generally, a computer 500 will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, implementations of the subject matter described in this disclosure can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending resources to and receiving resources from a device that is used by the user; for example, by sending web pages to a web browser on a user's client device in response to requests received from the web browser.

Some embodiments can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this disclosure, or any combination of one or more such back end, middleware, or front end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some implementations, a server transmits data (e.g., an HTML page) to a client device (e.g., for purposes of displaying data to and receiving user input from a user interacting with the client device). Data generated at the client device (e.g., a result of the user interaction) can be received from the client device at the server.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

While this disclosure contains many specific implementation details, these should not be construed as limitations on the scope of any inventions or of what may be claimed, but rather as descriptions of features specific to particular implementations of particular inventions. Certain features that are described in this disclosure in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations may be described in this disclosure or depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous.

Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

TERMINOLOGY

The phraseology and terminology used herein is for the purpose of description and should not be regarded as limiting.

The terms "approximately" or "substantially", the phrases "approximately equal to" or "substantially equal to", and other similar phrases, as used in the specification and the claims (e.g., "X has a value of approximately Y" or "X is approximately equal to Y"), should be understood to mean that one value (X) is within a predetermined range of another value (Y). The predetermined range may be plus or minus 20%, 10%, 5%, 3%, 1%, 0.1%, or less than 0.1%, unless otherwise indicated.

The indefinite articles "a" and "an," as used in the specification and in the claims, unless clearly indicated to the contrary, should be understood to mean "at least one." The phrase "and/or," as used in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

The use of "including," "comprising," "having," "containing," "involving," and variations thereof, is meant to encompass the items listed thereafter and additional items.

Use of ordinal terms such as "first," "second," "third," etc., in the claims to modify a claim element does not by itself connote any priority, precedence, or order of one claim element over another or the temporal order in which acts of a method are performed. Ordinal terms are used merely as labels to distinguish one claim element having a certain name from another element having a same name (but for use of the ordinal term), to distinguish the claim elements.

EQUIVALENTS

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. An integrated circuit, comprising:
a plurality of transmission gates disposed in a column, the plurality of transmission gates including first and second transmission gates, the first transmission gate including first and second control terminals, the second transmission gate including first and second control terminals;
one or more first metal wires extending between the first and second transmission gates in a direction substantially orthogonal to the column, the one or more first metal wires including a first control wire coupled to the first control terminals of the first and second transmission gates;
one or more second metal wires extending above the first and second transmission gates in the direction substantially orthogonal to the column, the one or more second metal wires including a second control wire coupled to the second control terminal of the first transmission gate; and
one or more third metal wires extending below the first and second transmission gates in the direction substantially orthogonal to the column, the one or more third metal wires including a third control wire coupled to the second control terminal of the second transmission gate.

2. The integrated circuit of claim 1, wherein the plurality of transmission gates further includes a third transmission gate, wherein the third transmission gate includes first and second control terminals, and wherein the second control wire extends between the first and third transmission gates and is coupled to the second control terminal of the third transmission gate.

3. The integrated circuit of claim 2, wherein the plurality of transmission gates further includes a fourth transmission gate, wherein the fourth transmission gate includes first and second control terminals, and wherein the third control wire extends between the second and fourth transmission gates and is coupled to the second control terminal of the fourth transmission gate.

4. The integrated circuit of claim 3, wherein the one or more first metal wires further include a first power supply wire coupled to provide a first power supply voltage, wherein the one or more second metal wires further include a second power supply wire coupled to provide a second power supply voltage, and wherein the one or more third metal wires further include a third power supply wire coupled to provide the second power supply voltage.

5. The integrated circuit of claim 4, wherein the column of transmission gates is a first column, the integrated circuit further comprising a plurality of latch circuits disposed in a second column proximate the first column, the plurality of latch circuits including a first latch circuit and a second latch circuit, the first latch circuit having a data input terminal coupled to a data terminal of the first transmission gate, the second latch circuit having a data input terminal coupled to a data terminal of the second transmission gate.

6. The integrated circuit of claim 5, wherein respective power supply terminals of the first latch circuit are coupled to the first power supply wire and the second power supply wire.

7. The integrated circuit of claim 6, wherein respective power supply terminals of the second latch circuit are coupled to the first power supply wire and the third power supply wire.

8. The integrated circuit of claim 5, comprising a plurality of flip-flops including a first flip-flop and a second flip-flop, the first flip-flop including the first transmission gate and the first latch, the second flip-flop including the second transmission gate and the second latch.

9. The integrated circuit of claim 5, wherein the one or more first metal wires further include a first enable wire coupled to a first enable terminal of the first latch circuit, to a first enable terminal of the second latch circuit, and to the second and third control wires, wherein the one or more second metal wires further include a second enable wire coupled to a second enable terminal of the first latch circuit, and wherein the one or more third metal wires further include a third enable wire coupled to a second enable terminal of the second latch circuit, to the second enable wire, and to the first control wire.

10. The integrated circuit of claim 9, further comprising a cell including the transmission gates, latch circuits, and metal wires, wherein a height of the cell is between 750 nm and 850 nm.

11. The integrated circuit of claim 1, wherein the first transmission gate includes a first n-type field-effect transistor (NFET) and a first p-type field-effect transistor (PFET), and wherein the second transmission gate includes a second NFET and a second PFET.

12. The integrated circuit of claim 11, wherein the first control terminal of the first transmission gate comprises a gate terminal of the first NFET, wherein the second control terminal of the first transmission gate comprises a gate terminal of the first PFET, wherein the first control terminal of the second transmission gate comprises a gate terminal of the second NFET, and wherein the second control terminal of the second transmission gate comprises a gate terminal of the second PFET.

13. The integrated circuit of claim 12, wherein the control terminals of the first and second transmission gates are vertically aligned.

14. A computer-implemented electronic design automation method comprising:

synthesizing, by a computer, an integrated circuit layout from a description of a circuit, the circuit including a multi-bit transmission gate, wherein a portion of the integrated circuit layout corresponding to the multi-bit transmission gate includes:

a plurality of transmission gates disposed in a column, the plurality of transmission gates including first and second transmission gates, the first transmission gate including first and second control terminals, the second transmission gate including first and second control terminals, one or more first metal wires extending between the first and second transmission gates in a direction substantially orthogonal to the column, the one or more first metal wires including a first control wire coupled to the first control terminals of the first and second transmission gates, one or more second metal wires extending above the first and second transmission gates in the direction substantially orthogonal to the column, the one or more second metal wires including a second control wire coupled to the second control terminal of the first transmission gate, and one or more third metal wires extending below the first and second transmission gates in the direction substantially orthogonal to the column, the one or more third metal wires including a third control wire coupled to the second control terminal of the second transmission gate.

15. The method of claim 14, wherein the description of the circuit includes a logical description of the circuit.

16. The method of claim 14, wherein the description of the circuit includes a schematic and/or a netlist.

17. The method of claim 14, further comprising simulating, by a computer, operation of the portion of the integrated circuit layout corresponding to the multi-bit transmission gate.

18. The method claim 17, further comprising generating, by a computer, a plurality of mask patterns for fabricating the integrated circuit including the multi-bit transmission gate.

* * * * *